United States Patent
Lee et al.

(10) Patent No.: US 8,507,914 B2
(45) Date of Patent: Aug. 13, 2013

(54) METHOD OF FABRICATING POLYSILICON, THIN FILM TRANSISTOR, METHOD OF FABRICATING THE THIN FILM TRANSISTOR, AND ORGANIC LIGHT EMITTING DIODE DISPLAY DEVICE INCLUDING THE THIN FILM TRANSISTOR

(75) Inventors: Dong-Hyun Lee, Yongin (KR); Ki-Yong Lee, Yongin (KR); Jin-Wook Seo, Yongin (KR); Tae-Hoon Yang, Yongin (KR); Maxim Lisachenko, Yongin (KR); Byoung-Keon Park, Yongin (KR); Kil-Won Lee, Yongin (KR); Jae-Wan Jung, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 202 days.

(21) Appl. No.: 12/649,980

(22) Filed: Dec. 30, 2009
(Under 37 CFR 1.47)

(65) Prior Publication Data

US 2010/0163855 A1 Jul. 1, 2010

(30) Foreign Application Priority Data

Dec. 30, 2008 (KR) .................. 10-2008-0137242

(51) Int. Cl.
*H01L 29/10* (2006.01)
*H01L 31/036* (2006.01)

(52) U.S. Cl.
USPC ................. 257/66; 257/49; 257/72

(58) Field of Classification Search
USPC ........................................... 257/65
See application file for complete search history.

(56) References Cited

U.S. PATENT DOCUMENTS

| | | | | |
|---|---|---|---|---|
| 6,693,044 | B1 * | 2/2004 | Yamazaki et al. | 438/745 |
| 2002/0125480 | A1 | 9/2002 | Nakamura et al. | |
| 2003/0010980 | A1 | 1/2003 | Yamazaki et al. | |
| 2003/0094611 | A1 * | 5/2003 | Hayakawa | 257/49 |
| 2006/0033106 | A1 | 2/2006 | Seo et al. | |
| 2008/0157116 | A1 * | 7/2008 | Park et al. | 257/101 |

FOREIGN PATENT DOCUMENTS

| | | |
|---|---|---|
| CN | 1396626 | 2/2003 |
| CN | 1734787 | 2/2006 |
| CN | 101211985 | 7/2008 |
| EP | 1 939 933 | 7/2008 |
| JP | 10-050609 | 2/1998 |

(Continued)

OTHER PUBLICATIONS

European Search Report issued Apr. 7, 2010, in corresponding European Patent Application No. 09180959.0.

*Primary Examiner* — Daniel Whalen
(74) *Attorney, Agent, or Firm* — H.C. Park & Associates, PLC

(57) ABSTRACT

A thin film transistor, a method of fabricating the thin film transistor, and an organic light emitting diode (OLED) display device equipped with the thin film transistor of which the thin film transistor includes a substrate, a buffer layer disposed on the substrate, a first semiconductor layer and a second semiconductor layer disposed on the buffer layer, a gate electrode insulated from the first semiconductor layer and the second semiconductor layer, a gate insulating layer insulating the gate electrode from the first semiconductor layer and the second semiconductor layer, and source and drain electrodes insulated from the gate electrode and partially connected to the second semiconductor layer, wherein the second semiconductor layer is disposed on the first semiconductor layer.

13 Claims, 7 Drawing Sheets

(56) References Cited

FOREIGN PATENT DOCUMENTS

| | | |
|---|---|---|
| JP | 10-106951 | 4/1998 |
| JP | 11-204435 | 7/1999 |
| KR | 10-2000-0055877 | 9/2000 |
| KR | 10-2006-0017410 | 2/2006 |
| KR | 10-0770266 | 10/2007 |
| KR | 10-2008-0061733 | 7/2008 |

* cited by examiner

METHOD OF FABRICATING POLYSILICON, THIN FILM TRANSISTOR, METHOD OF FABRICATING THE THIN FILM TRANSISTOR, AND ORGANIC LIGHT EMITTING DIODE DISPLAY DEVICE INCLUDING THE THIN FILM TRANSISTOR

CROSS-REFERENCE TO RELATED APPLICATIONS

This application claims the benefit of Korean Patent Application No. 10-2008-0137242, filed Dec. 30, 2008, the disclosure of which is hereby incorporated herein by reference in its entirety.

BACKGROUND OF THE INVENTION

1. Field of the Invention

Aspects of the present invention relate to a thin film transistor, a method of fabricating the thin film transistor, and an organic light emitting diode (OLED) display device including the thin film transistor.

2. Description of the Related Art

In general, a polysilicon layer can be applied to high field effect mobility circuits and high operating speed circuits. Polysilicon has the advantage of being applicable to complementary metal-oxide-semiconductor (CMOS) circuit structures and is widely used in semiconductor layers of thin film transistors. Such a thin film transistor is often used as an active device in active matrix liquid crystal displays (AMLCDs) and as a switching device or driving device of organic light emitting diodes (OLEDs).

Methods of crystallizing amorphous silicon to form polysilicon include solid phase crystallization, excimer laser crystallization, metal induced crystallization, and metal induced lateral crystallization. Solid phase crystallization is a method of annealing an amorphous silicon layer for a number of hours at a maximum temperature of about 700° C., which is the melting temperature of a glass substrate of a display device including a thin film transistor. Excimer laser crystallization achieves crystallization by irradiating an amorphous silicon layer with an excimer laser to locally heat it to a high temperature for a very short time. Metal induced crystallization induces a phase-change of an amorphous silicon layer into a polysilicon layer by placing the amorphous silicon layer in contact with, or doping it with, a metal such as nickel, palladium, gold or aluminum. Metal induced lateral crystallization involves inducing sequential crystallization of an amorphous silicon layer while a silicide formed by the reaction of metal and silicon expands laterally.

However, solid phase crystallization has the disadvantages of an excessively long processing time as well as the tendency of a substrate to warp due to lengthy, high-temperature heat treatment. The excimer laser crystallization has the disadvantages of requiring an expensive laser and forming crystallized surface protrusions that degrade the characteristics of a semiconductor layer—gate insulating layer interface.

At present, methods employing a metal to crystallize an amorphous silicon layer are being extensively researched, because they have the advantages of being able to produce crystallization at a lower temperature and within a shorter time, as compared to solid phase crystallization. Crystallization methods employing a metal include metal induced crystallization (MIC), metal induced lateral crystallization (MILC), and super grain silicon (SGS) crystallization.

One important factor determining the characteristics of a thin film transistor is a leakage current. Especially in semiconductor layers crystallized using a metal catalyst, the metal catalyst may remain in a channel region and thereby increase the leakage current. Accordingly, if the concentration of the metal catalyst remaining in the channel region is not controlled, the leakage current of the thin film transistor increases, and its electrical characteristics are degraded.

SUMMARY OF THE INVENTION

Aspects of the present invention provide a thin film transistor employing a semiconductor layer crystallized using a metal catalyst, a method of fabricating the transistor, an organic light emitting diode (OLED) display device including the transistor, and a method of fabricating the OLED display device.

According to aspects of the present invention, a thin film transistor includes: a buffer layer disposed on a substrate; a first semiconductor layer and a second semiconductor layer disposed on the buffer layer, the second semiconductor layer being formed on the first semiconductor layer; a gate electrode disposed on the substrate and insulated from the first semiconductor layer and the second semiconductor layer; a gate insulating layer to insulate the gate electrode from the first semiconductor layer and the second semiconductor layer; and source and drain electrodes insulated from the gate electrode and connected to the second semiconductor layer.

According to another exemplary embodiment of the present invention, an organic light emitting diode (OLED) display device includes: a buffer layer formed on a substrate; a first semiconductor layer and a second semiconductor layer formed on the buffer layer, the second semiconductor layer being formed on the first semiconductor layer; a gate electrode disposed on the substrate and insulated from the first semiconductor layer and the second semiconductor layer; a gate insulating layer to insulate the gate electrode from the first semiconductor layer and the second semiconductor layer; source and drain electrodes insulated from the gate electrode and connected to the second semiconductor layer; an insulating layer disposed on the substrate to cover the source and drain electrodes; and a first electrode, an organic light emitting layer, and a second electrode disposed on the insulating layer, the first electrode being connected to one of the source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
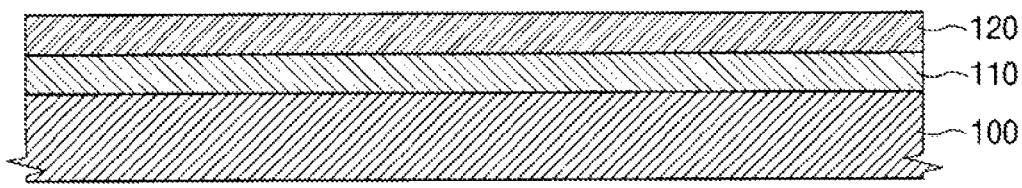
FIGS. 1A to 1G illustrate a method of fabricating a polysilicon layer according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. When it is described that a first part is "connected" to a second part, the first and second parts can be directly electrically connected (no intervening elements) or can be indirectly electrically connected (intervening elements may be present). Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In the drawings, the lengths or thicknesses of layers and regions are exaggerated for clarity.

Figure 1B:
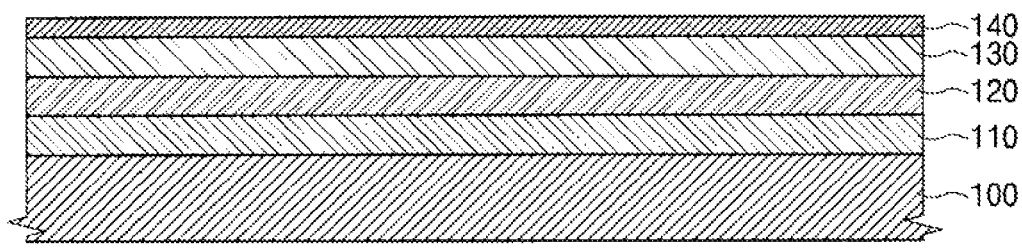
Figure 1C:
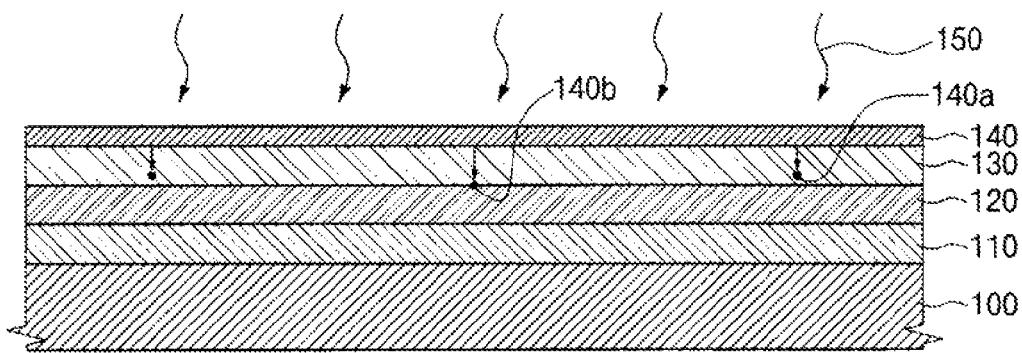
Figure 1D:
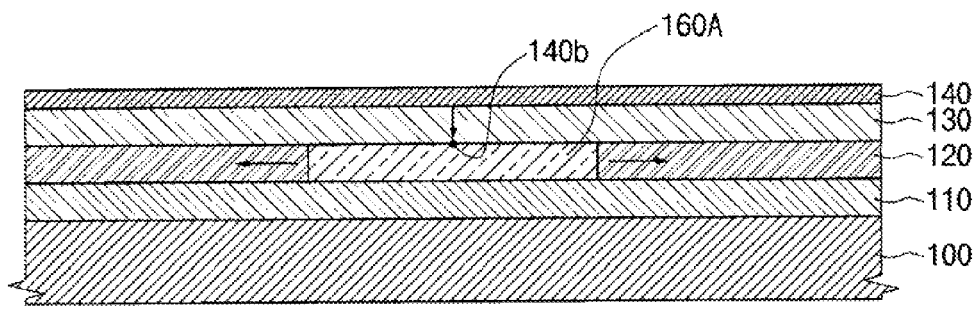
Figure 1E:
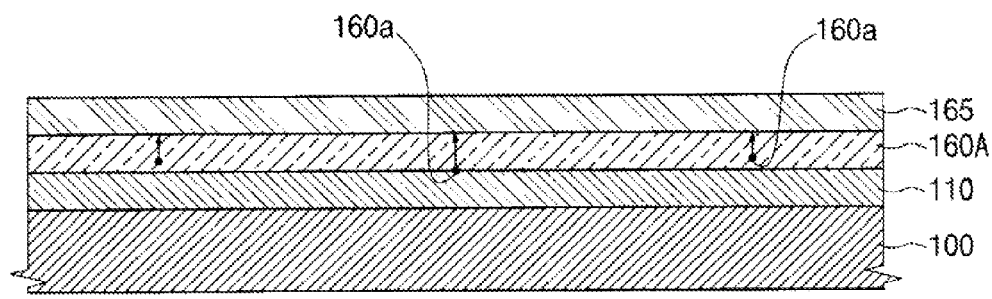
Figure 1F:
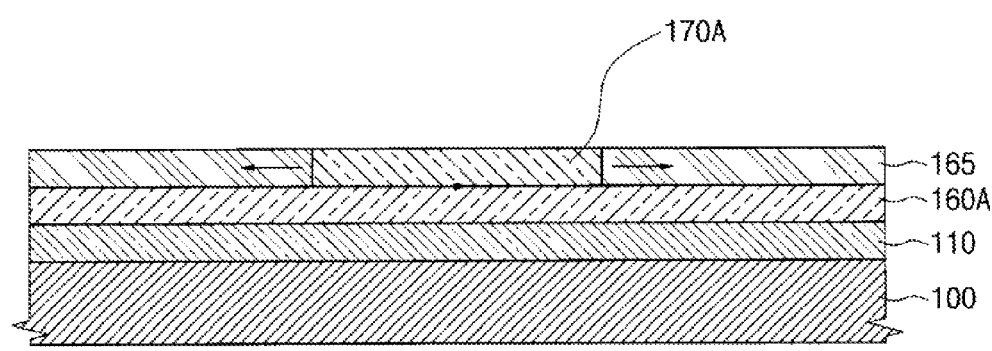

FIGS. 1A and 1F are cross-sectional views illustrating a crystallization process according to a first exemplary embodiment of the present invention. Referring to FIG. 1A, a buffer layer 110 is formed on a substrate 100. The substrate 100 may be formed of a material such as glass or plastic. The buffer layer 110 can be formed as a single layer using an insulating film, such as a silicon oxide film or silicon nitride film, using chemical vapor deposition or physical vapor deposition; or the buffer layer 110 can be formed as a laminate structure of such films. The buffer layer 110 prevents the diffusion of moisture or impurities from the substrate 100 and controls the heat transfer rate during crystallization. Thus, it facilitates crystallization of an amorphous silicon layer. However, aspects of the present invention are not limited thereto such that the buffer layer 110 need not be included in all aspects.

Subsequently, a first amorphous silicon layer 120 is formed on the buffer layer 110 using chemical vapor deposition or physical vapor deposition. Either when the first amorphous silicon layer 120 is formed, or after the first amorphous silicon layer 120 is formed, a dehydrogenation process may be performed to reduce the concentration of hydrogen therein.

Next, the first amorphous silicon layer 120 is crystallized into a polysilicon layer using a crystallization method employing a metal catalyst, such as metal induced crystallization (MIC), metal induced lateral crystallization (MILC), or super grain silicon (SGS) crystallization. Here, upon crystallization of the first amorphous silicon layer 120 into a crystallized polysilicon layer region, the crystallized polysilicon layer region is referred to as a first metal catalyst crystallization region.

Below, exemplary embodiments of the present invention in which SGS crystallization is used will be described. SGS crystallization is a method that enables the size of crystal grains to be adjusted in the range of from several to several hundreds of μm by adjusting the concentration of a metal catalyst that diffuses into the amorphous silicon layer to a low concentration level. For example, a capping layer may be formed on the amorphous silicon layer, a metal catalyst layer may be formed on the capping layer, and then the metal catalyst diffused by annealing into the amorphous silicon layer. However, aspects of the present invention are not limited thereto such that the concentration of the metal catalyst diffused into the amorphous silicon layer may be limited to a low concentration by another method, such as forming the metal catalyst layer on the amorphous silicon layer at a low concentration.

FIG. 1B is a cross-sectional view of a process of forming the capping layer and the metal catalyst layer on the first amorphous silicon layer. Referring to FIG. 1B, a capping layer 130 is formed on the first amorphous silicon layer 120. Here, the capping layer 130 may be formed of a silicon nitride layer that enables diffusion of a metal catalyst, which is formed in a subsequent process, via an annealing process. A multilayer of a silicon oxide layer and a silicon nitride layer may alternatively be used. The capping layer 130 can be formed by a method such as chemical vapor deposition or physical vapor deposition. The capping layer 130 may be formed to a thickness of about 1 Å to 2000 Å. If the thickness of the capping layer 130 is less than 1 Å, the capping layer 130 may not sufficiently inhibit diffusion of the metal catalyst, while if it is greater than 2000 Å, a sufficient amount of the metal catalyst may not diffuse into the amorphous silicon layer 120.

Subsequently, the metal catalyst is deposited on the capping layer 130 to form a metal catalyst layer 140. The metal catalyst may be any one selected from the group consisting of Ni, Pd, Ag, Au, Al, Sn, Sb, Cu, Tb, Cd, and combinations thereof. The metal catalyst layer 140 is formed on the capping layer 130 with an areal density of $10^{11}$ to $10^{15}$ atoms/cm$^2$. When formed with an areal density of less than $10^{11}$ atoms/cm$^2$, there is an insufficient number seeds of crystallization (i.e., crystallization nuclei) such that it may be difficult to crystallize the first amorphous silicon layer into a polysilicon layer by SGS crystallization. Meanwhile, when formed with an areal density of more than $10^{15}$ atoms/cm$^2$, too much metal catalyst may diffuse into the first amorphous silicon layer and crystal grains of the polysilicon layer become too small, too much metal catalyst remains in the polysilicon layer, and characteristics of a resultant semiconductor layer, which is formed by patterning the polysilicon layer, are degraded.

FIG. 1C is a cross-sectional view of a process of annealing the substrate to diffuse a metal catalyst through the capping layer and transport it to the interface of the first amorphous silicon layer. Referring to FIG. 1C, the substrate 100 on which the buffer layer 110, the first amorphous silicon layer 120, the capping layer 130, and the metal catalyst layer 140 are formed is subjected to an annealing process 150, which causes the transportation of some of the metal catalyst (140b) in the metal catalyst layer 140 into the surface of the first amorphous silicon layer 120. That is, a small amount of metal catalyst 140b among the metal catalyst 140a and 140b diffuses through the capping layer 130 due to the annealing process 150 into the first amorphous silicon layer 120, while most of the metal catalyst 140a does not make it to the amorphous silicon layer 120 or is unable to pass through the capping layer 130.

Accordingly, the amount of metal catalyst reaching the surface of the first amorphous silicon layer 120 is determined by the diffusion regulating ability of the capping layer 130, which is related to its thickness. That is, the thicker the capping layer 130, the smaller the amount of diffusion of the metal catalyst 140a and 140b resulting in larger crystal grains, while the thinner the capping layer 130, the greater the amount of diffusion of the metal catalyst 140a and 140b resulting in smaller crystal grains.

Here, the annealing process 150 is performed from several seconds to several hours at a temperature of 200° C. to 900° C., and preferably 350° C. to 500° C., to diffuse the metal catalyst 140b to the first amorphous silicon layer 120. Performing the annealing process 150 for such a time and at such a temperature can prevent substrate warping caused by excessive heat and is preferable in terms of fabrication cost and yield. The annealing process 150 may employ any one of a furnace process, a rapid thermal annealing (RTA) process, a UV process, and a laser process.

FIG. 1D is a cross-sectional view of crystallizing the first amorphous silicon layer into a polysilicon layer using the diffused metal catalyst. Referring to FIG. 1D, the first amorphous silicon layer 120 is crystallized into a first metal catalyst crystallization region 160A by the metal catalyst 140b, which diffused through the capping layer 130 into the surface of the first amorphous silicon layer 120. That is, the metal catalyst 140b combines with silicon of the amorphous silicon layer 120 to form a metal silicide, the metal silicide forms seeds of crystallization (i.e., crystallization nuclei), the amorphous silicon layer 120 crystallizes into a polysilicon layer thereby forming the first metal catalyst crystallization region 160A. The first metal catalyst crystallization region 160A crystallized by the SGS crystallization method may referred to as a first SGS crystallization region 160A.

Although, in FIG. 1D, the annealing process 150 is performed without removing the capping layer 130 and the metal catalyst layer 140 aspects of the present invention are not limited thereto. For example, after diffusing the metal catalyst 140B into the surface of first amorphous silicon layer 120 to form the metal silicide crystallization nuclei, the capping layer 130 and the metal catalyst layer 140 may be removed before annealing.

Figure 1G:
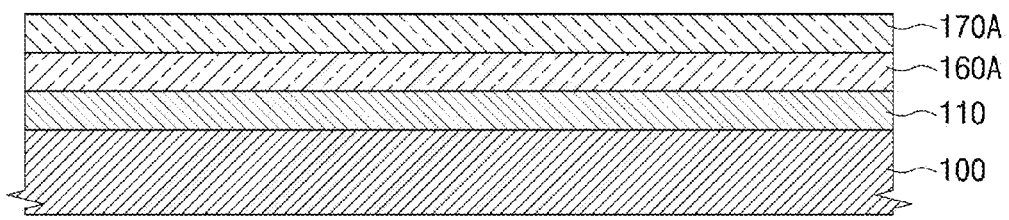

Referring to FIGS. 1E and 1G, when crystallization is performed as described above, the capping layer 130 and the metal catalyst layer 140 are removed, and then a second amorphous silicon layer 165 is formed on the first metal catalyst crystallization region 160A.

Then, an annealing process is performed similar to the annealing performed on the first amorphous silicon layer 120. When the annealing process is performed, residual metal catalyst 160a remaining in the first metal catalyst crystallization region 160A diffuses upward into the second amorphous silicon layer 165 to form seeds of crystallization, and the second amorphous silicon layer 165 is crystallized into a second metal catalyst crystallization region 170A. Since the second metal catalyst crystallization region 170A is crystallized by the residual metal catalyst 160a remaining in the first metal catalyst crystallization region 160A, the amount of residual metal catalyst is smaller in the second metal catalyst crystallization region 170A than in the first metal catalyst crystallization region 160A. The second metal catalyst crystallization region 170A crystallized by the SGS crystallization method may be referred to as a second SGS crystallization region 170A, which is crystallized by diffusion of residual metal catalyst 160a from the first SGS crystallization region 160A.

In addition, crystal grains of the second metal catalyst crystallization region 170A, i.e., the second SGS crystallization region 170A, are about 3 to 4 times larger than crystal grains of the first metal catalyst crystallization region 160A, i.e., the first SGS crystallization region 160A. Also, if the surface of the crystallization region is etched and observed, seeds are not visible in the defined portions, and crystal grain boundaries are indistinct and unclear. Such results are because, while there are seeds on a top surface of the first metal catalyst crystallization region 160A, the second metal catalyst crystallization region 170A forms seeds at a bottom surface, which then grow upward, i.e., away from the substrate 100. Therefore, crystal grain boundaries are decreased in the second metal catalyst crystallization region 170A with respect to the first metal catalyst crystallization region 160A, which results in a lower barrier to charge mobility, and superior electrical characteristics.

Figure 1H:
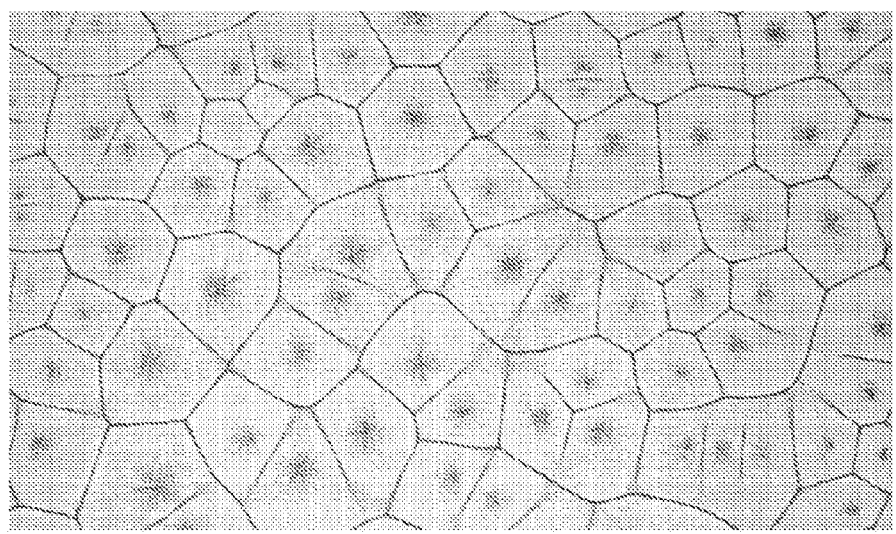
FIG. 1H is a micrograph of a first metal catalyst crystallization region according to an exemplary embodiment of the present invention.
Figure 1I:
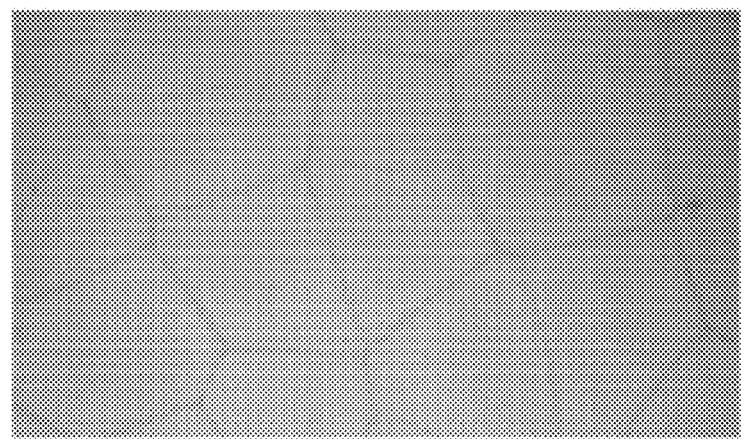
FIG. 1I is a micrograph of a second metal catalyst crystallization region according to an exemplary embodiment of the present invention.

FIG. 1H is a micrograph of the surface of the first metal catalyst crystallization region 160A, and FIG. 1I is a micrograph of the surface of the second metal catalyst crystallization region 170A. Referring to FIGS. 1H and 1I, seeds of crystallization can be seen with the naked eye inside crystal grains and grain boundaries are distinct on the surface of the first metal catalyst crystallization region 160A of FIG. 1G. However, looking at the second metal catalyst crystallization region 170A crystallized by residual metal catalyst 160a in the first metal catalyst crystallization region 160A, crystal grain boundaries are indistinct and there are no seeds of crystallization. Since the seeds of crystallization are formed at the bottom of the second metal catalyst crystallization region 170A where it contacts the first metal catalyst crystallization region 160A and crystallization proceeds upwards from there, i.e., away from the substrate 100, seeds can be found in the bottom of the second metal catalyst crystallization region 170A if the second metal catalyst crystallization region 170A is etched several times. Also, since the second metal catalyst crystallization region 170A is crystallized by residual metal catalyst 160a of the first metal catalyst crystallization region 160A, the amount of residual metal catalyst in the second metal catalyst crystallization region 170A is smaller than in the first metal catalyst crystallization region 160A. Based on these differences, the first metal catalyst crystallization region 160A, i.e., the first SGS crystallization region 160A, can be distinguished from the second metal catalyst crystallization region 170A, i.e., the second SGS crystallization region.

Figure 2A:
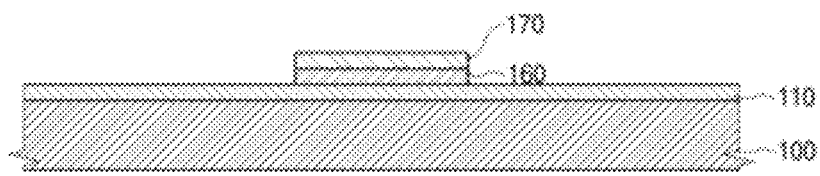
FIGS. 2A to 2C illustrate a top gate thin film transistor according to an exemplary embodiment of the present invention.
Figure 2B:
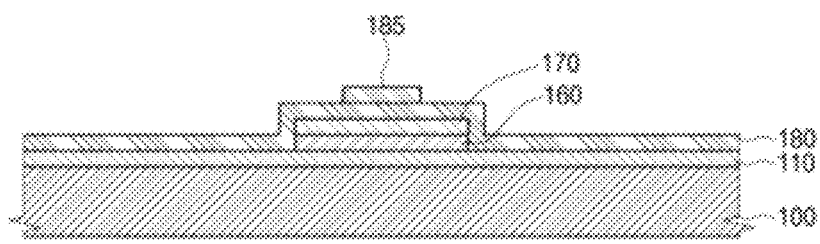
Figure 2C:
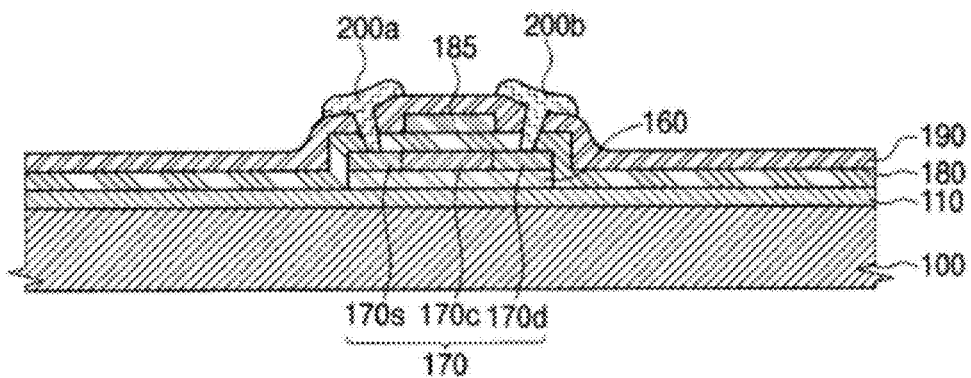

FIGS. 2A to 2C are cross-sectional views illustrating fabrication of a top gate thin film transistor according to an exemplary embodiment of the present invention. Referring to FIG. 2A, the first metal catalyst crystallization region 160A and the second metal catalyst crystallization region 170A of the substrate 100 shown in FIG. 1G are disposed on the substrate 100 and the buffer layer 110 and are patterned to form a first semiconductor layer 160 and a second semiconductor layer 170. The first semiconductor layer 160 crystallized by the SGS crystallization method may be referred to as a first SGS crystallization region, and the second semiconductor layer 170 crystallized by the SGS crystallization method may be referred to as a second SGS crystallization region.

Referring to FIG. 2B, a gate insulating layer 180 is formed over the entire surface of the substrate 100 including the second semiconductor layer 170. The gate insulating layer 180 may be a silicon oxide layer, a silicon nitride layer, or a dual silicon oxide/silicon nitride layer. Further, the gate insulating layer 180 need not cover the entire surface of the substrate 100, but may only be disposed on the first and second semiconductor layers 170 and 180 and the substrate 100 to sufficiently insulate such from a later-formed gate electrode 185.

Continuing, a metal layer (not shown) for a gate electrode is formed on the gate insulating layer 180 as a single layer of aluminum (Al) or an aluminum alloy, such as aluminum-neodymium (Al—Nd), or a laminate multilayer of aluminum alloy on top of a chromium (Cr) or molybdenum (Mo) alloy. The metal layer for a gate electrode is etched in a photolithography process to form the gate electrode 185 disposed on a part of the second semiconductor layer 170 corresponding to a channel region 170c of the second semiconductor layer 170.

Referring to FIG. 2C, an interlayer insulating layer 190 is formed over the entire surface of the substrate 100 including the gate electrode 185. The interlayer insulating layer 190 may be a silicon oxide layer, a silicon nitride layer, or a multilayer thereof. Further, the interlayer insulating layer 190 need not cover the entire surface of the substrate 100, but may only be disposed on the gate electrode 185, the first and second semiconductor layers 170 and 180, and the substrate 100 to sufficiently insulate such from later-formed source/drain electrodes 200a and 200b.

Subsequently, the interlayer insulating layer 190 and the gate insulating layer 180 are etched to form contact holes exposing source/drain regions 170s and 170d of the second semiconductor layer 170. Source/drain electrodes 200a and 200b connected to the source/drain regions 170s and 170d through the contact holes are then formed. Here, the source/drain electrodes 200a and 200b may be formed of any one selected from the group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), molybdenum alloy (Mo alloy), aluminum alloy (Al alloy), and copper alloy (Cu alloy). In this way, a thin film transistor including the semiconductor layer 170, the gate electrode 185, and the source/drain electrodes 200a and 200b is completed.

Table 1 compares characteristics of semiconductor layers formed from the second SGS crystallization region according to an exemplary embodiment of the present invention and a conventional first SGS crystallization region.

TABLE 1

|  | Threshold Voltage (Vth) | Electron Mobility (cm²/Vs) | S Factor (V/dec) | Off Current (A/μm) | Driving Voltage Range |
| --- | --- | --- | --- | --- | --- |
| Exemplary Embodiment | −1.82 | 59.74 | 0.48 | $3.20 \times 10^{-12}$ | −2.18 |
| Comparative Example | −2.52 | 51.44 | 0.58 | $6.02 \times 10^{-12}$ | −2.38 |

In the exemplary embodiment, the semiconductor layer is formed, as described above, after forming the first metal catalyst crystallization region using the metal catalyst and then forming the second metal catalyst crystallization region by performing a second process of crystallization using residual metal catalyst remaining in the first metal catalyst crystallization region. In the comparative example, the semiconductor layer is formed after forming a first metal catalyst crystallization region using an ordinary metal catalyst.

As shown in Table 1, the exemplary embodiment semiconductor layer has a lower threshold voltage, better electron mobility, and a smaller S factor than the comparative example semiconductor layer. Also, the exemplary embodiment semiconductor layer has superior off current characteristics.

Figure 3A:
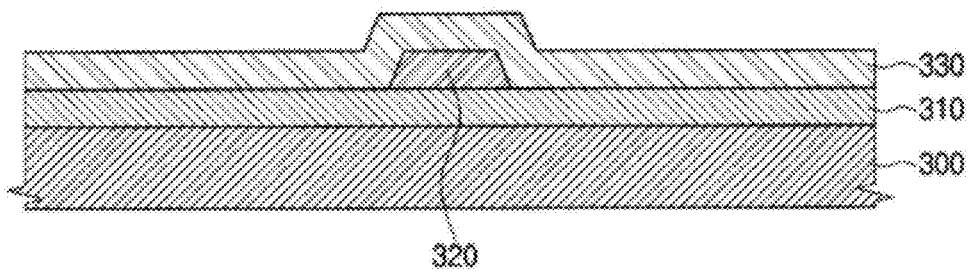
FIGS. 3A to 3D illustrate a bottom gate thin film transistor according to an exemplary embodiment of the present invention.
Figure 3B:
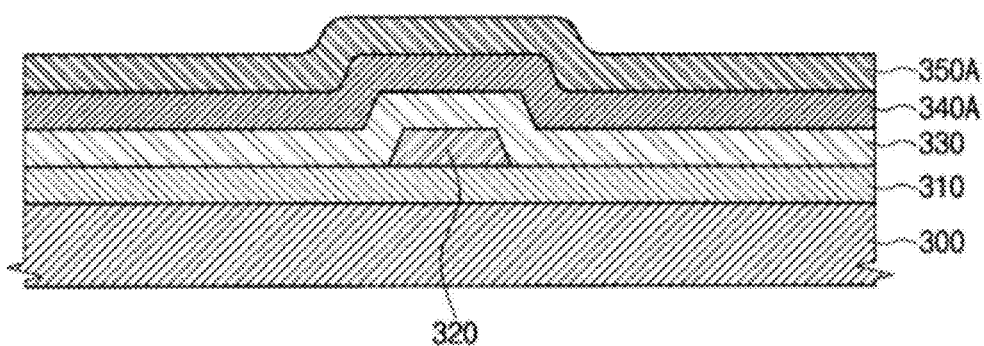
Figure 3C:
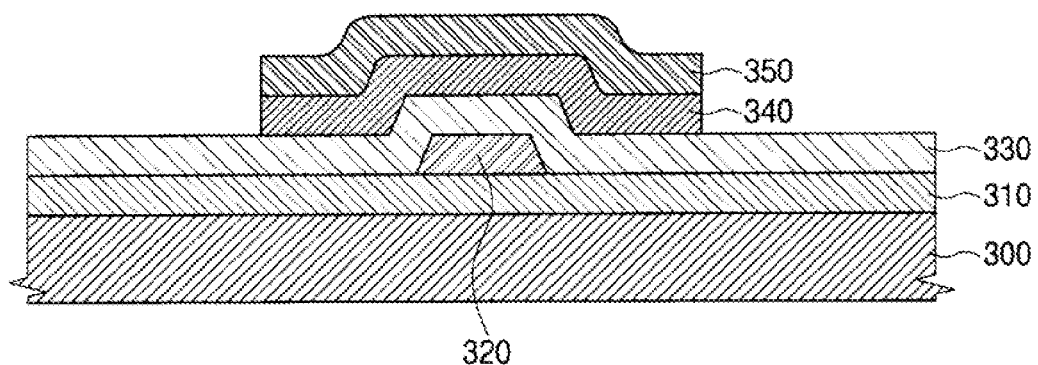
Figure 3D:
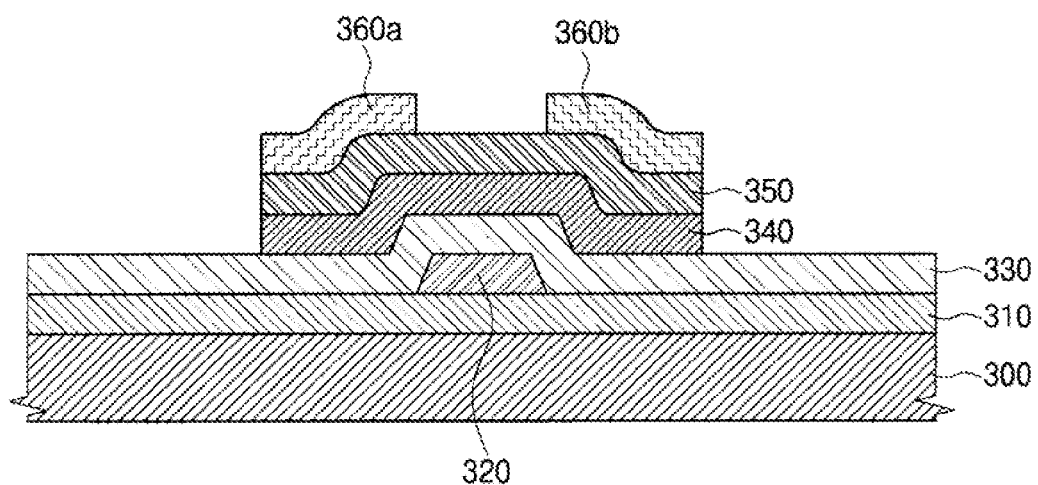

FIGS. 3A to 3C are cross-sectional views illustrating the fabrication of a bottom gate thin film transistor formed according to an exemplary embodiment of the present invention. Referring to FIG. 3A, a buffer layer 310 is formed on a substrate 300. A metal layer (not shown) for a gate electrode is formed on the buffer layer 310, and a gate electrode 320 is formed by etching the metal layer for a gate electrode using a photolithography process. Subsequently, a gate insulating layer 330 is formed on the substrate 300 on which the gate electrode 320 is formed.

Subsequently, referring to FIG. 3B, a first amorphous silicon layer is formed on the gate insulating layer 330 and crystallized using a metal catalyst as described above to form a first metal catalyst crystallization region 340A. Then, a second amorphous silicon layer is formed on the first metal catalyst crystallization region 340A and crystallized by the diffusion of the residual metal catalyst from the first metal catalyst crystallization region 340A as described above to form a second metal catalyst crystallization region 350A.

Subsequently, referring to FIG. 3C, the first metal catalyst crystallization region 340A and the second metal catalyst crystallization region 350A of the substrate 300 are patterned to form a first semiconductor layer 340 and a second semiconductor layer 350, respectively. The first semiconductor layer 340 crystallized by the SGS crystallization method may be referred to as a first SGS crystallization region, and the second semiconductor layer 350 crystallized by the SGS crystallization method may be referred to as a second SGS crystallization region.

Subsequently, a source/drain conductive layer (not shown) is formed on the substrate 300 and patterned to form source/drain electrodes 360a and 360b. The source/drain electrodes 360a and 360b may be formed of any one selected from the group consisting of molybdenum (Mo), chromium (Cr), tungsten (W), molybdenum-tungsten (MoW), aluminum (Al), aluminum-neodymium (Al—Nd), titanium (Ti), titanium nitride (TiN), copper (Cu), a molybdenum alloy (Mo alloy), an aluminum alloy (Al alloy), and a copper alloy (Cu alloy). In this way, a bottom gate thin film transistor including the first semiconductor layer 340, the second semiconductor layer 350, the gate electrode 320, and the source/drain electrodes 360a and 360b is completed.

Figure 4:
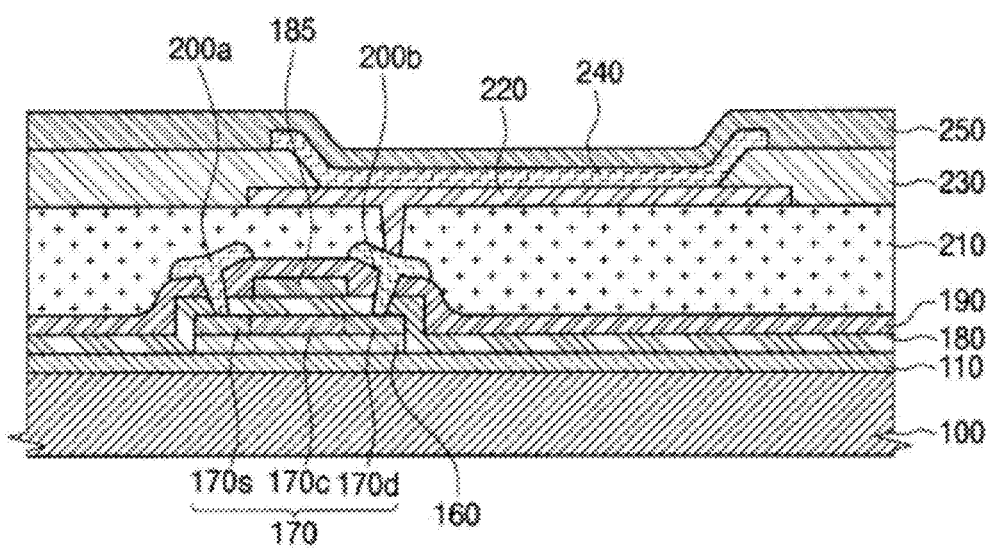
FIG. 4 illustrates an organic light emitting diode (OLED) display device according to an exemplary embodiment of the present invention.

FIG. 4 is a cross-sectional view of an organic light emitting diode (OLED) display device including a top gate thin film transistor formed using the exemplary embodiment as shown in FIG. 2C. Referring to FIG. 4, an insulating layer 210 is formed on the entire surface of the substrate 100 including the thin film transistor according to the exemplary embodiment as shown in FIG. 2C. The insulating layer 210 may be formed of an inorganic film that is formed of one selected from a silicon oxide film, a silicon nitride film, and SOG, or an organic film that is formed of one selected from a polyimide, a benzocyclobutene series resin, and an acrylate. Also, it may be formed in a laminate structure of the inorganic film and the organic film.

The insulating layer 210 is etched to form a via hole exposing the source or drain electrode 200a or 200b. A first electrode 220 connected to either one of the source and drain electrodes 200a and 200b through the via hole is formed. The first electrode 220 may be formed as an anode or a cathode. When the first electrode 220 is an anode, it may be formed of a transparent conductive layer selected from the group consisting of ITO, IZO, and ITZO. When the first electrode 220 is a cathode, it may be formed using Mg, Ca, Al, Ag, Ba, or an alloy thereof.

Subsequently, a pixel defining film 230 having an opening through which a part of the surface of the first electrode 220 is exposed is formed on the first electrode 220, and an organic layer 240 including a light-emitting layer is formed on the exposed first electrode 220. The organic layer 240 may include any one or a plurality of layers selected from the group consisting of a hole injection layer, a hole transport layer, a hole suppression layer, an electron suppression layer, an electron injection layer, and an electron transport layer, or laminate structures thereof. Next, the second electrode 250 is formed on the organic layer 240. In this way, an OLED display device according to one exemplary embodiment of the present invention is completed.

Accordingly, the semiconductor layer of a thin film transistor and an OLED display device formed using the method of fabricating polysilicon according to exemplary embodiments of the present invention has superior properties to a semiconductor layer formed by conventional SGS crystallization, and thus, is highly effective when used in a display device.

Aspects of the present invention provide a thin film transistor equipped with a semiconductor layer crystallized using a metal catalyst, a method of fabricating the transistor, and an OLED display device equipped with the transistor. They also provide a method of forming a superior semiconductor layer whose crystal grains are larger and amount of the remaining metal is smaller than a conventional semiconductor layer crystallized using a metal catalyst. They also provide a thin film transistor having an improved threshold voltage and Ioff characteristics, a method of fabricating the transistor, and an OLED display device including the transistor. Aspects of the present invention enable manufacture of devices having improved characteristics.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
    a substrate;
    a buffer layer formed on the substrate;
    a first semiconductor layer and a second semiconductor layer disposed on the buffer layer, the second semiconductor layer being formed on the first semiconductor layer;
    a gate electrode disposed on the substrate and insulated from the first semiconductor layer and the second semiconductor layer;
    a gate insulating layer to insulate the gate electrode from the first semiconductor layer and the second semiconductor layer; and
    source and drain electrodes insulated from the gate electrode and connected to the second semiconductor layer,
    wherein the second semiconductor layer comprises a channel region corresponding to the gate electrode, and
    wherein crystal grains in the channel region of the second semiconductor layer are larger than crystal grains in a region of the first semiconductor layer corresponding to the gate electrode.

2. The thin film transistor of claim 1, wherein the first semiconductor layer and the second semiconductor layer are polysilicon layers crystallized from amorphous silicon by a metal catalyst.

3. The thin film transistor of claim 1, wherein the first semiconductor layer is a first super grain silicon (SGS) crystallization region and the second semiconductor layer is a second SGS crystallization region.

4. The thin film transistor of claim 1, wherein the first semiconductor layer comprises more metal catalyst than the second semiconductor layer.

5. The thin film transistor of claim 1, wherein the thin film transistor comprises:
    the buffer layer is disposed directly on the substrate;
    the first semiconductor layer is disposed directly on the buffer layer;
    the second semiconductor layer is disposed directly on the first semiconductor layer;
    the gate insulating layer is disposed to cover at least the first semiconductor layer and the second semiconductor layer; and
    the gate electrode is disposed on the gate insulating layer above the second semiconductor layer.

6. The thin film transistor of claim 5, wherein the gate insulating layer covers the entire surface of the substrate.

7. The thin film transistor of claim 1, wherein
    the buffer layer is disposed directly on the substrate;
    the gate electrode is disposed directly on the buffer layer;
    the gate insulating layer is disposed to cover at least the gate electrode;
    the first semiconductor layer disposed on the gate insulating layer above the gate electrode; and
    the second semiconductor layer is disposed on the first semiconductor layer.

8. The thin film transistor of claim 7, wherein the gate insulating layer covers the entire surface of the substrate.

9. An organic light emitting diode (OLED) display device, comprising:
    a substrate;
    a buffer layer formed on the substrate;
    a first semiconductor layer and a second semiconductor layer disposed on the buffer layer;
    a gate electrode disposed on the substrate and insulated from the first semiconductor layer and the second semiconductor layer;
    a gate insulating layer to insulate the gate electrode from the first semiconductor layer and the second semiconductor layer;
    source and drain electrodes insulated from the gate electrode and connected to the second semiconductor layer;
    an insulating layer disposed on the substrate to cover the source and drain electrodes; and
    a first electrode, an organic light emitting layer, and a second electrode disposed on the insulating layer, the first electrode being connected to one of the source and drain electrodes,
    wherein the second semiconductor layer comprises a channel region corresponding to the gate electrode, and
    wherein crystal grains in the channel region of the second semiconductor layer are larger than crystal grains in a region of the first semiconductor layer corresponding to the gate electrode.

10. The device of claim 9, wherein the first semiconductor layer and the second semiconductor layer are polysilicon layers crystallized from amorphous silicon by a metal catalyst.

11. The device of claim 9, wherein the first semiconductor layer is a first super grain silicon (SGS) crystallization region and the second semiconductor layer is a second SGS crystallization region.

12. The device of claim 9, wherein the first semiconductor layer comprises more metal catalyst than the second semiconductor layer.

13. The device of claim 9, wherein
    the first semiconductor layer is disposed on the buffer layer;
    the second semiconductor layer is disposed on the first semiconductor layer;
    the gate insulating layer is disposed on the substrate to cover at least the first semiconductor layer and the second semiconductor layer;
    the gate electrode is disposed on the gate insulating layer.

* * * * *